(12) United States Patent
Tsai et al.

(10) Patent No.: US 10,998,218 B1
(45) Date of Patent: May 4, 2021

(54) WET CLEANING APPARATUS AND MANUFACTURING METHOD USING THE SAME

(71) Applicant: NANYA TECHNOLOGY CORPORATION, New Taipei (TW)

(72) Inventors: Feng-Ju Tsai, Hsinchu County (TW); Shyue-Ru Doong, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/729,464

(22) Filed: Dec. 29, 2019

(51) Int. Cl.
*H01L 21/67* (2006.01)
*H01L 21/687* (2006.01)

(52) U.S. Cl.
CPC ........ *H01L 21/687* (2013.01); *H01L 21/6719* (2013.01); *H01L 21/67051* (2013.01); *H01L 21/67196* (2013.01)

(58) Field of Classification Search
CPC ............. H01L 21/67051; H01L 21/687; H01L 21/6719; H01L 21/67196; H01L 21/6704
See application file for complete search history.

(56) References Cited

U.S. PATENT DOCUMENTS

| | | | | |
|---|---|---|---|---|
| 5,625,433 A * | 4/1997 | Inada | ................. | G03F 7/70858 396/604 |
| 7,428,907 B2 * | 9/2008 | Okuda | ..................... | B08B 1/04 134/148 |
| 7,891,366 B2 * | 2/2011 | Ito | ...................... | H01L 21/6704 134/137 |
| 8,051,862 B2 * | 11/2011 | Ito | ..................... | H01L 21/67051 134/94.1 |
| 8,678,684 B2 * | 3/2014 | Yamamoto | ............ | G03F 7/3021 396/611 |
| 9,028,621 B2 * | 5/2015 | Miyagi | ............. | H01L 21/67028 134/30 |
| 9,535,328 B2 * | 1/2017 | Takeishi | ................ | G03F 7/3021 |
| 2010/0269865 A1 * | 10/2010 | Sekiguchi | ......... | H01L 21/67034 134/30 |
| 2016/0096203 A1 * | 4/2016 | Kai | ..................... | H01L 21/0206 134/30 |
| 2017/0084470 A1 * | 3/2017 | Suzuki | ..................... | B08B 3/10 |
| 2017/0316961 A1 * | 11/2017 | Nakamori | ............. | H01L 21/304 |
| 2018/0068875 A1 * | 3/2018 | Takeaki | ............. | H01L 21/683 |
| 2020/0218155 A1 * | 7/2020 | Lim | .................. | H01L 21/02282 |

FOREIGN PATENT DOCUMENTS

| | | |
|---|---|---|
| CN | 103442849 A | 12/2013 |
| TW | 201200250 A | 1/2012 |
| TW | 201937548 A | 9/2019 |

* cited by examiner

*Primary Examiner* — Kaitlin S Joerger
(74) *Attorney, Agent, or Firm* — CKC & Partners Co., LLC

(57) ABSTRACT

A device includes a wafer chuck, a first nozzle, an actuator, and a first elongated cup. The first nozzle is disposed over the wafer chuck. The first elongated cup is coupled to the actuator. The actuator is capable of moving the first elongated cup from a first position to a second position. The first elongated cup shields the first nozzle from the wafer chuck at the first position. The first elongated cup is free of shielding the first nozzle from the wafer chuck at the second positon.

20 Claims, 9 Drawing Sheets

US 10,998,218 B1

WET CLEANING APPARATUS AND MANUFACTURING METHOD USING THE SAME

BACKGROUND

In the manufacturing of integrated circuits, cleaning techniques such as wet chemicals and dry plasma are used to remove various contaminations from wafers, for example, fall-on particles from processing chambers and photoresist residuals from dry etching. However, the wet cleaning process can be one of the contamination sources to wafer, for example, the defects formed by a process liquid dropped accidentally from a nozzle onto the wafer in the wet cleaning process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
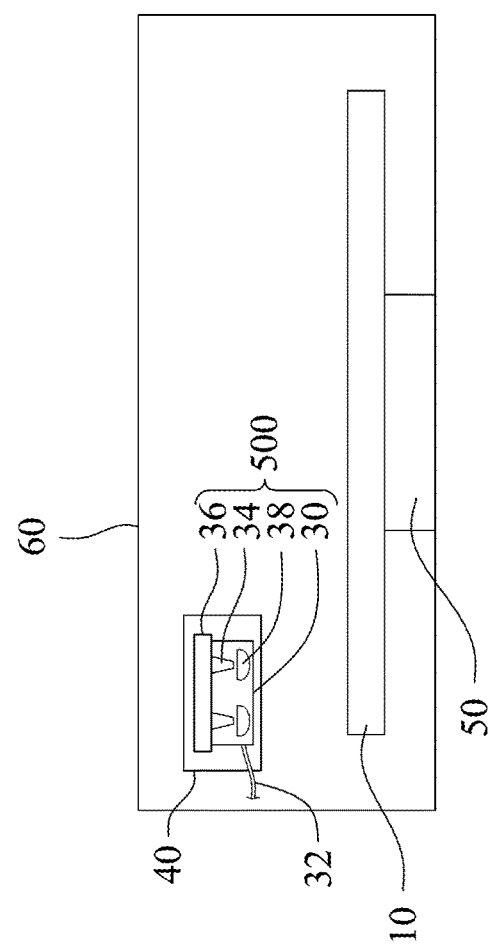
FIG. 1B is a lateral view of the wet cleaning apparatus in FIG. 1A.
Figure 1B:

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "bottom," "above," "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

Disclosed embodiments relate to methods and apparatuses for reducing formation of defect in wafer cleaning process. The embodiments such as those disclosed herein are applicable not only to front-end-of-line (FEOL) processing but also to middle-end-of-line (MEOL) processing and back-end-of-line (BEOL) processing.

Figure 1A:
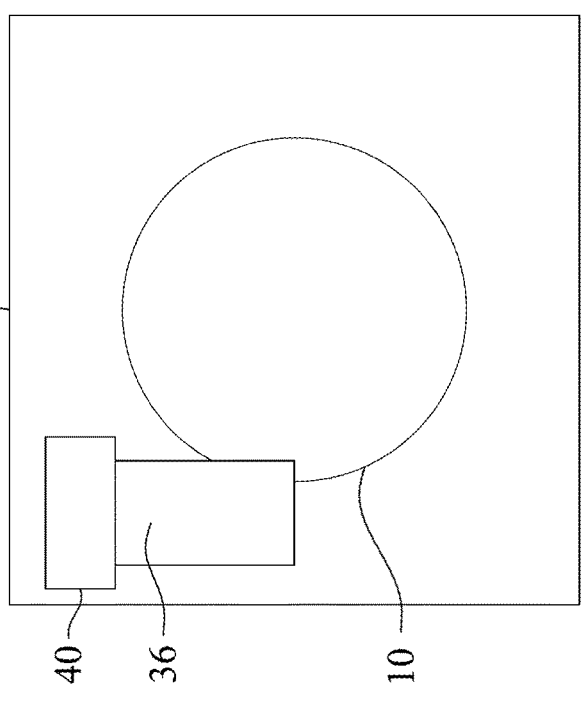
FIG. 1A is a top view of a wet cleaning apparatus in stand-by mode in accordance with some embodiments.
Figure 2B:
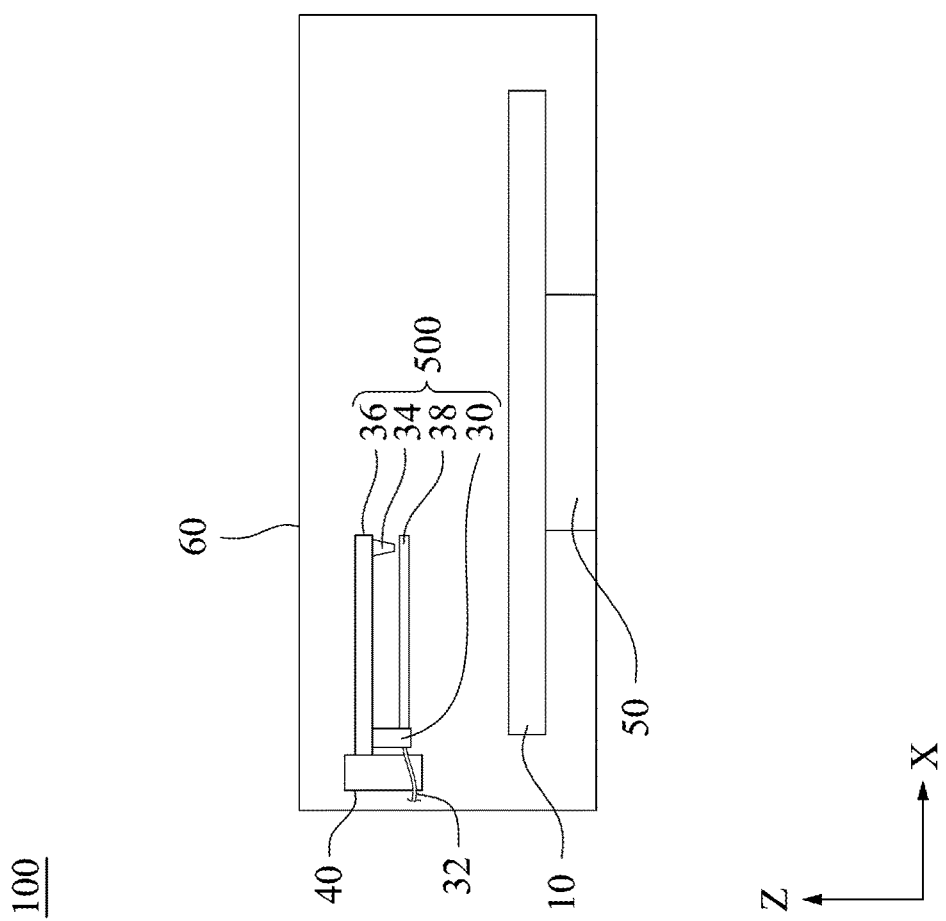
FIG. 2B is a lateral view of the wet cleaning apparatus in FIG. 2A.
Figure 2A:
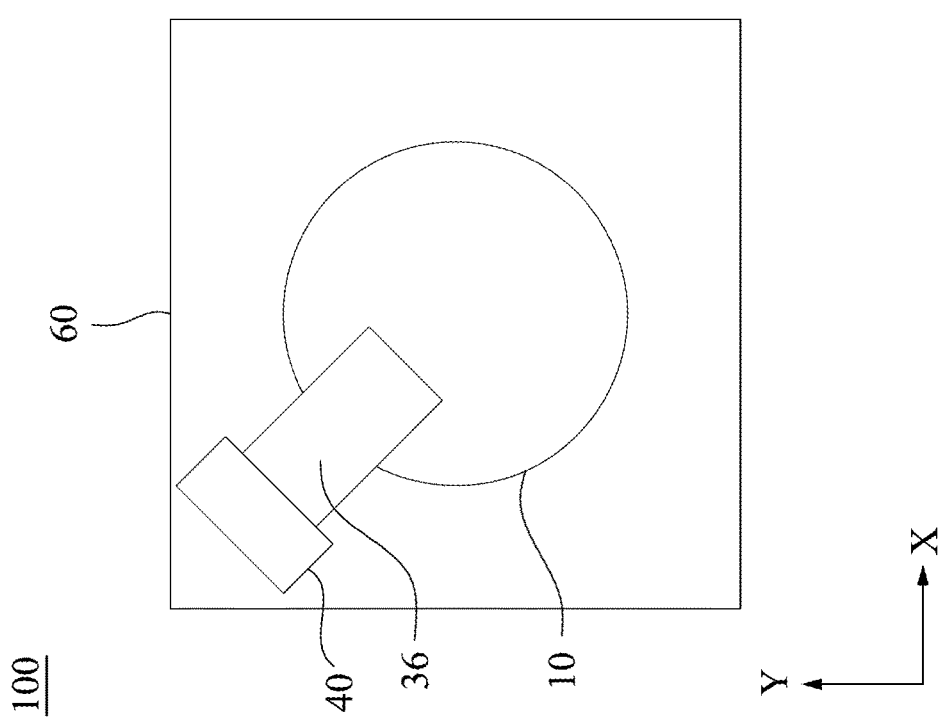
FIG. 2A is a top view of the wet cleaning apparatus in active mode.

FIG. 1A is a top view of a wet cleaning apparatus 100 in standby mode in accordance with some embodiments, and FIG. 1B is a lateral view of the wet cleaning apparatus 100 in FIG. 1A. FIG. 2A is a top view of the wet cleaning apparatus 100 in active mode, and FIG. 2B is a lateral view of the wet cleaning apparatus 100 in FIG. 2A.

The wet cleaning apparatus 100 is configured to clean one or more wafers 10 by using wet chemicals. In some embodiments, the wafer 10 is positioned for cleaning by a process liquid applying by a first nozzle 34. In some embodiments, the wet cleaning apparatus 100 includes a processing chamber 60, a wafer chuck 50, a base 40, an arm portion 500.

The chamber 60 has at least one sidewall. The sidewall defines an accommodating space in the chamber 60 to accommodate a wafer 10. The wafer chuck 50 is disposed in the processing chamber 60 to support the wafer 10. In some embodiments, the wafer chuck 50 is an electrostatic chuck (ESC). In other embodiments, the wafer chuck 50 is rotatable and its spin speed ranging from about 50 rpm to 4000 rpm.

The base 40 is disposed in the chamber 60 and the arm portion 500 is connected movably to the base 40. The arm portion 500 can be moved horizontally and vertically over the wafer chuck by the base 40. In some embodiments, the base 40 is located aside the wafer chuck 50 and capable of moving the arm portion 500 from a first positon away from the chuck as shown in FIG. 1A to a second positon closer to the chuck as shown in FIG. 2A.

Figure 3A:
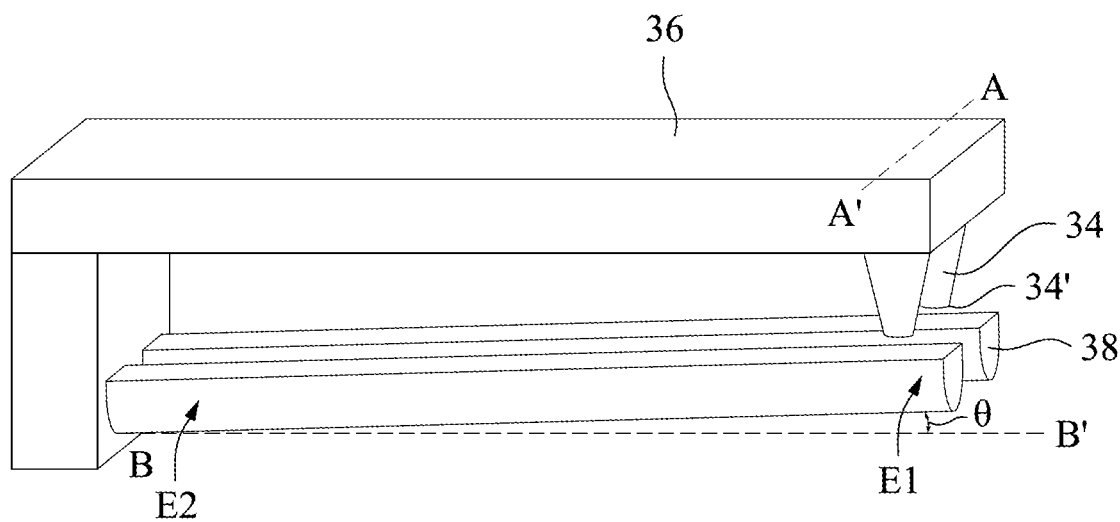
FIGS. 3A and 3B are perspective views of the arm portion of the wet cleaning apparatus according to some embodiments.
Figure 3B:
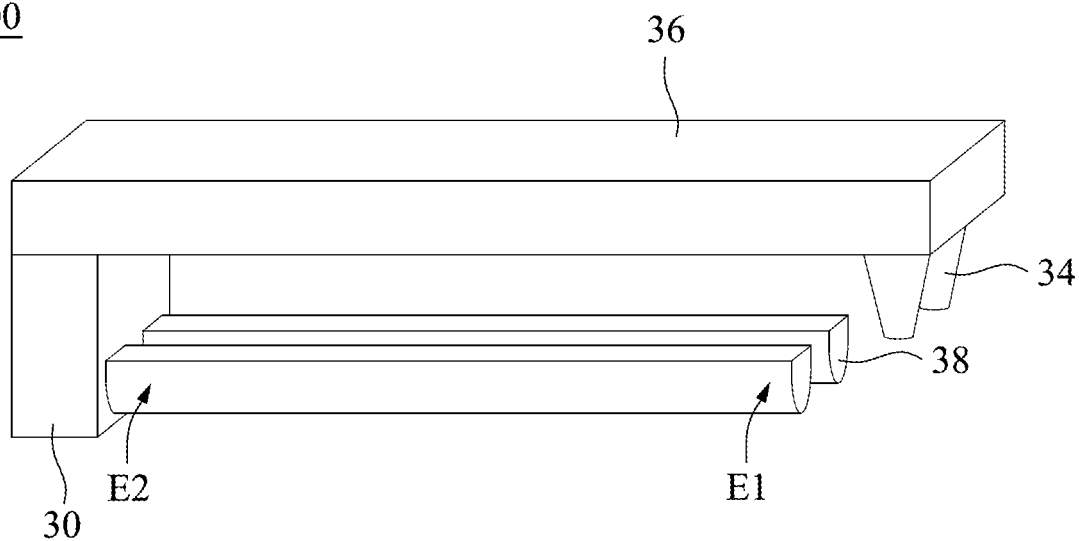

FIGS. 3A and 3B are schematic views of the arm portion 500 of the wet cleaning apparatus 100 according to some embodiments. The arm portion 500 includes an arm 36, a first nozzle 34, an actuator 30 and a first elongated cup 38.

The first nozzle 34 is disposed on the arm 36 for applying one or more process liquids onto the wafer 10. In some embodiments, the first nozzle 34 is disposed on an end of the arm 36 as shown in FIG. 3A. Referring back to FIGS. 2A and 2B, when the arm 36 is active and moved to a positon over the wafer chuck, the first nozzle 34 aligns with the center area of the wafer 10 in direction of gravity and applies a process liquid to the center area of the wafer 10.

The first nozzle 34 includes a nozzle tip 34' as shown in FIG. 3A. In some embodiments, the first nozzle 34 is in a shape of cylinder and the nozzle tip 34' is located at an end of the first nozzle 34. The process liquid (now shown) flows out from the first nozzle 34 via the nozzle tip 34' and then reaches the wafer 10 (not shown). The first nozzle 34 is substantially made of corrosion-resistant materials. In some embodiments, the nozzle tip 34' is made of a material as same as the material of the first nozzle. In other embodiments, both the first nozzle and nozzle tip are substantially made of Teflon™.

The first elongated cup 38 is disposed below the first nozzle 34 and coupled to the actuator 30, as shown in FIG. 2B. The first elongated cup 38 is configured to collect a portion of process liquid dropped from the first nozzle tip 34'. In some embodiments, the first elongated cup 38 is made of corrosion-resistant materials. In some embodiments, the first elongated cup 38 is substantially made of Teflon™.

The actuator 30 is coupled to the arm 36 and the first elongated cup 38 is coupled to the actuator 30. The actuator 30 is configured to enable the movement of the first elongated cup 38 in horizontal and in vertical below the first nozzle 34.

In some embodiments, the actuator 30 is capable of moving the first elongated cup 38 to a first position where the first elongated cup 38 shields the first nozzle 34 from the wafer chuck (now shown) as shown in the FIG. 3A. When the first elongated cup 38 shields the first nozzle 34 from the wafer chuck, the first elongated cup 38 is able to collect the process liquid (not shown) dropped from the nozzle tip 34'.

In some embodiments, the actuator 30 is capable of moving the first elongated cup 38 to a second position where the first elongated cup 38 is free of shielding the first nozzle 34 from the wafer chuck (not shown) as shown in the FIG. 3B. When the first elongated cup 38 is free of shielding the first nozzle 34 from the wafer chuck, the first nozzle 34 can apply the process liquid onto the wafer 10 (not shown).

The actuator 30 can be any suitable device that can achieve the movements stated above of first elongated cup 38. In some embodiments, the actuator 30 includes a joint, which can rotate and thereby move the first elongated cup 38 back and forth under the first nozzle 34. In some embodiments, the actuator 30 includes a motor that driving the movements of the first elongated cup 38.

Referring to FIG. 3A, the first elongated cup 38 includes a first end E1 and a second end E2 opposite to the first end E1. The first end E1 is closer to the first nozzle 34 and the second end E2 is away from the first nozzle 34. When the first elongated cup 38 shields the first nozzle 34 from the wafer chuck, the second end E2 is below the first end E1 and thereby the first elongated cup has a tilt angle θ with respect to horizontal line BB'. The tilt angle θ of the first elongated cup causes the collected process liquid flowing along the first elongated cup towards the second end E2. In some embodiments, the angle θ ranging from about 5 degree to 30 degree.

At the second position where the first elongated cup 38 is free of shielding the first nozzle 34 from the wafer chuck (not shown) as shown in the FIG. 3B, the first end E1 and the second end E2 of the first elongated cup 38 are substantially at the same horizontal level.

Figure 4A:
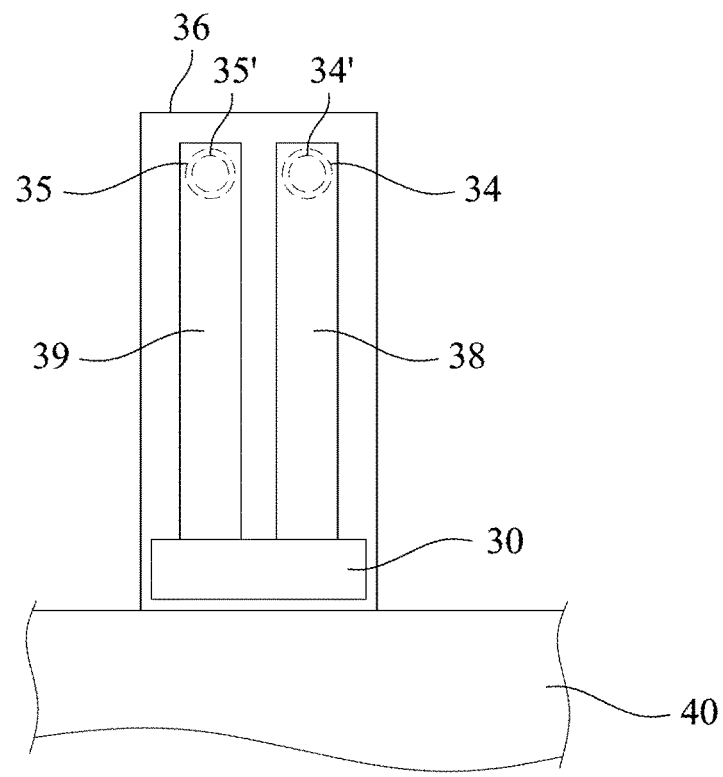
FIG. 4A is a bottom view of the arm portion with a pair of nozzles according to some embodiments.
Figure 4B:
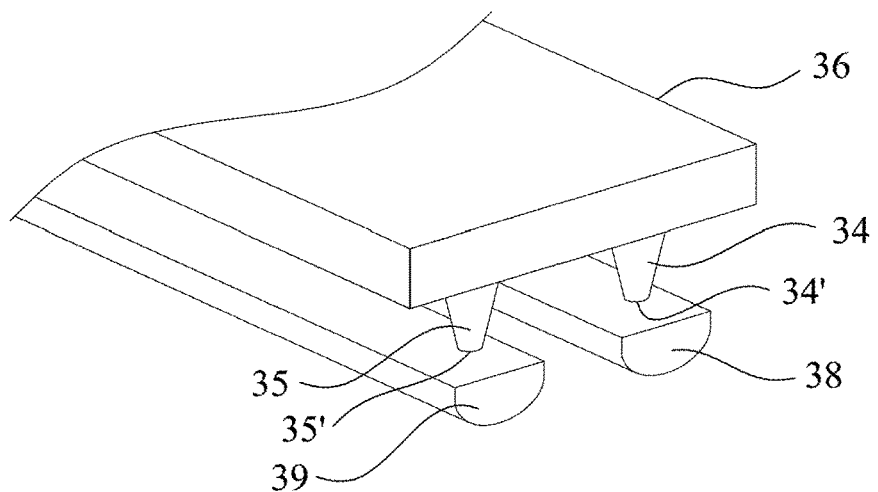
FIG. 4B is a side view of the arm portion shown in FIG. 4A.

The arm portion 500 further includes a second nozzle 35 disposed next to the first nozzle 34. FIG. 4A is a bottom view of the arm portion 500 with a pair of nozzles according to some embodiments, and FIG. 4B is a perspective view schematically illustrating the arm portion 500 shown in FIG. 4A. The second nozzle 35 can be used to apply another type of process liquid on the wafer 10. In some embodiment, the first nozzle 34 provides NH₄OH-based chemicals and the second nozzle 35 provides HCl-based chemicals.

The arm portion 500 further includes a second elongated cup 39. Similarly, the second elongated cup 39 is configured to collect a portion of the process liquid dropped from a second nozzle tip 35' of the second nozzle 35.

Similar to the configuration among the first nozzle 34, the first elongated cup 38 and actuator 30, the second nozzle 35 is coupled to the actuator 30 which is capable of moving the second nozzle 35 from a third positon to a fourth positon. At the third position, the second elongated cup 39 shields the second nozzle 35 from the wafer chuck. At the fourth position, the second elongated cup 39 is free of shielding the second nozzle 35 from the wafer chuck.

In some embodiments, the second nozzle 35 is substantially made of corrosion-resistant materials. In some embodiments, the second nozzle tip 35' is made of a material as same as the material of the second nozzle 35. In other embodiments, both the second nozzle 35 and the second nozzle tip 35' are substantially made of Teflon™.

In some embodiments, the second elongated cup 39 is made of corrosion-resistant materials. In some embodiments, the second elongated cup 39 is substantially made of Teflon™.

Referring back to FIG. 2B, when processing a wafer 10 in the wet clean apparatus 100, the wafer 10 is disposed on the wafer chuck 50 and the first nozzle 34 is moved to a position over the wafer 10. Applying a process liquid thorough the first nozzle 34 for cleaning the wafer 10, a portion of liquid may be retained on the nozzle tip 34' when stopping applying the process liquid. The portion of process liquid on the nozzle tip 34' may drop accidentally onto wafer and result in formations of defects, for example, water marks. The present invention discloses a wet clean apparatus including movable elongated cups respectively disposed below each nozzle to collect the process liquid dropped from each nozzle tip.

The backsplash of the process liquid may occur when the first elongated cup 38 is collecting the process liquid dropped from the first nozzle 34 at the higher position. The backsplash may contaminate the nozzle tip 34' and lead to a clogging of the nozzle tip 34'. Moreover, the process liquid spills back to the wafer, resulting in formation of defects on the wafer.

Figure 5:
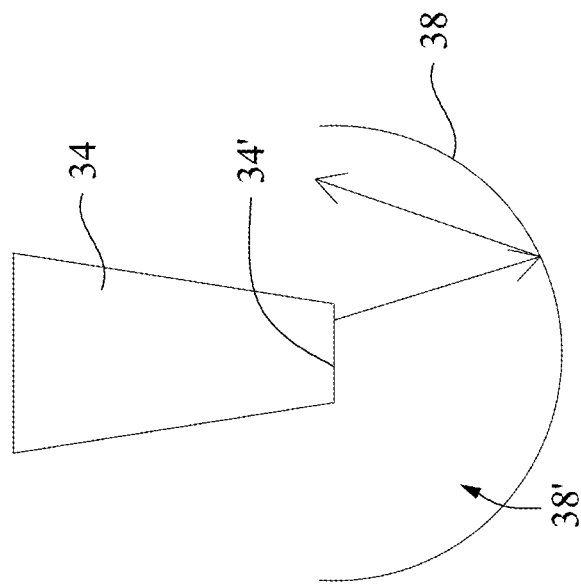
FIG. 5 is a cross-section view of the line A-A' in FIG. 3A in accordance with some embodiments.

FIG. 5 is a cross-section view of line A-A' in FIG. 3A in accordance with some embodiments, the arm 36 is not shown for simplicity. The first elongated cup 38 has a holding space 38' that can be used to collect process liquid (not shown) undesirably dropped from the first nozzle 34. To mitigate the backsplash, the first elongated cup 38 is disposed closer to the first nozzle 34. In some embodiments, the first nozzle tip 34' is located in the holding space 38' when the first elongated cup 38 is at the first position where the first nozzle 34 is shielded by the first elongated cup 38 from the wafer chuck.

Figure 6A:
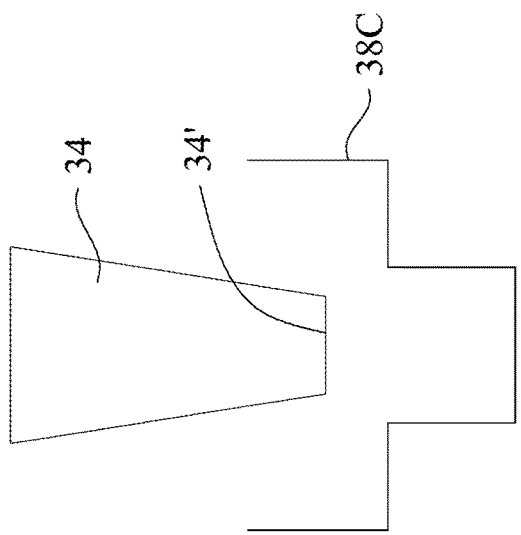
FIGS. 6A-6C illustrate the different types of sidewalls of the first elongated cup in accordance with some embodiments.
Figure 6B:
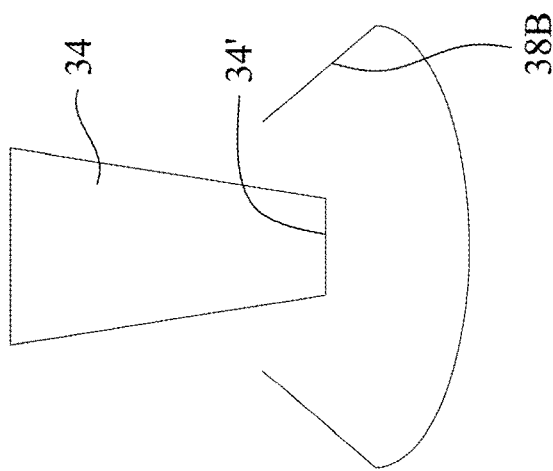
Figure 6C:
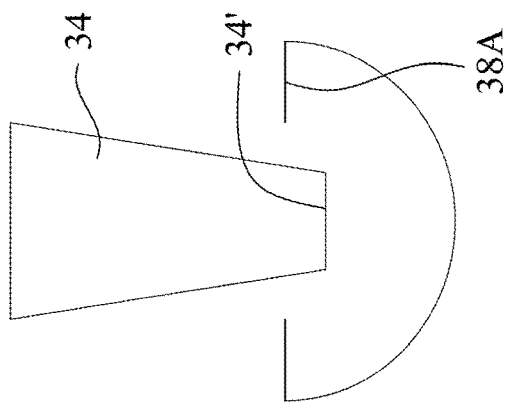

The sidewalls of the first elongated cup 38 can be further optimized for avoiding the backsplash of the process liquid. FIGS. 6A-6C illustrate the different types of sidewall of the first elongated cup 38 in accordance with some embodiments. It's understood that the design of sidewalls of the first elongate cup 38 is not limited to these shown in FIGS. 6A-6C but can be any suitable designs that mitigate the backsplash.

FIG. 6A illustrates one type of the sidewalls of the first elongated cup 38. The first elongated cup 38 includes at least a sidewall having a curvature. Additional two sidewalls 38A are added on the top of the first elongated cup 38 without hindering the nozzle tip 34', thus the process liquid spilling back to the wafer can be mitigated.

FIG. 6B illustrates another type of the sidewalls of the first elongated cup 38. The sidewalls 38B are tilted and the bottom is enlarged to accommodate the process liquid. Because the holding space of the first elongated cup 38 is enlarged and the opening the first elongated cup 38 is narrowed, the backsplash of the process liquid becomes less severe.

FIG. 6C illustrates one another type of the sidewalls of the first elongated cup 38. The sidewalls 38C are shaped to accommodate the shape of the first nozzle, the backsplash is reduced.

The wet cleaning apparatus 100 further comprise a drain pipeline 32 disposed in the chamber 60 and coupled to the first elongated cup 38 as shown in FIG. 2B. The drain pipeline 32 is configured to purge the collected process liquid out of the first elongated cup 38. In some embodiments, the drain pipeline 32 is coupled to the first elongated cup 34 and the second elongated cup 35 via the actuator 30.

In some embodiments, the drain pipeline is made of corrosion-resistant materials. In other embodiments, the drain pipeline is made of a material as same as the material of the nozzles. In some embodiments, the drain pipeline is substantially made of Teflon™.

Figure 7:
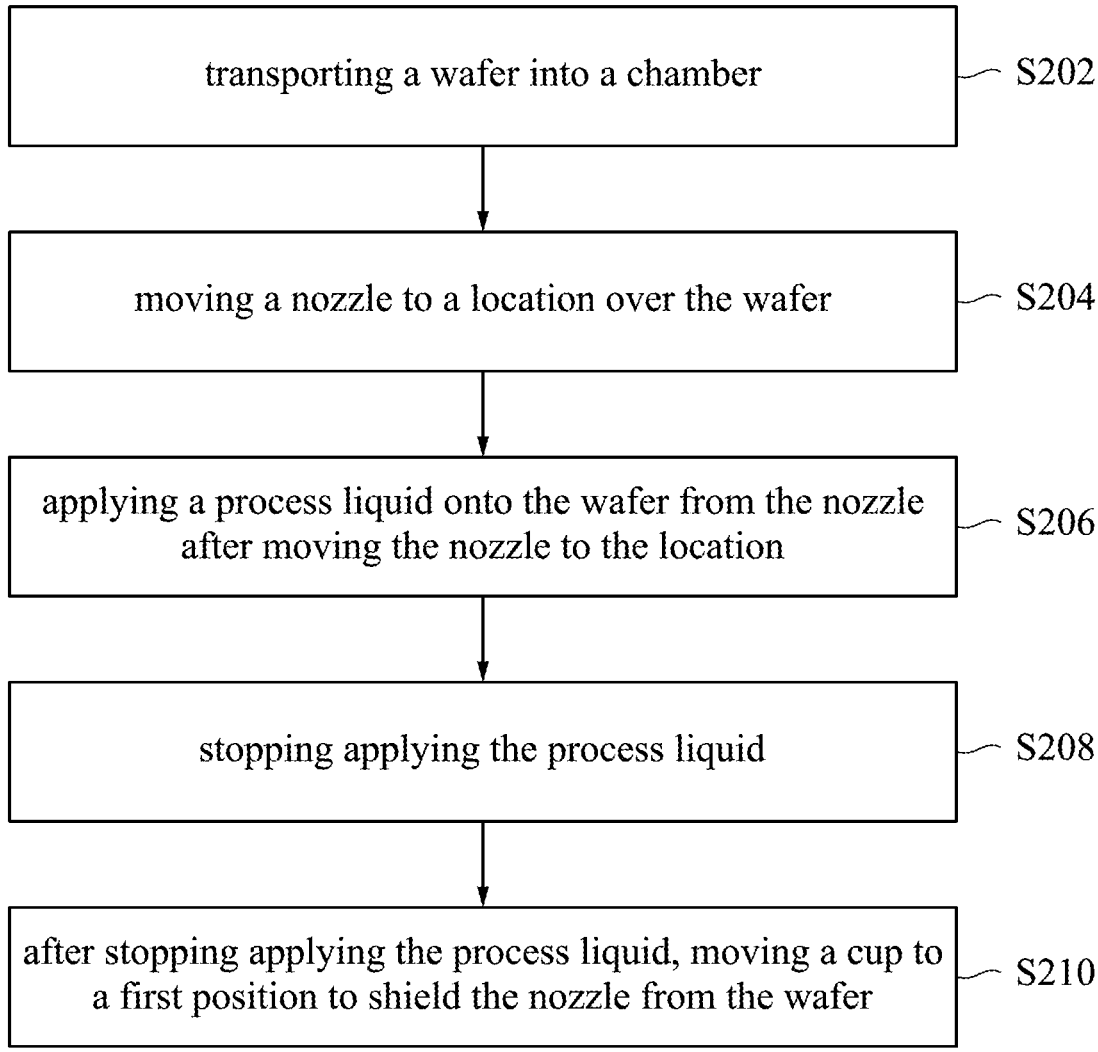
FIG. 7 is a flow chart of a method using the wet cleaning apparatus in accordance with some embodiments.

FIG. 7 is a flow chart of a method M200 using the wet cleaning apparatus 100 in accordance with some embodiments. The method M200 may be used in the front end of line (FEOL), middle end of line (MEOL) and back end of line (BEOL) of a manufacturing process integrated circuit (IC).

In some embodiments, the method M200 can be used in cleaning the wafer post etched such as plasma etching. In certain embodiments, the method M200 can be used in cleaning the wafer post deposition such as physical vapor deposition (PVD) or chemical vapor deposition (CVD). In other embodiments, the method M200 can be used in cleaning the wafer post planarization such as chemical mechanical polishing (CMP) or grinding.

FIGS. 8A-8D illustrate respectively one of sequential operations for method M200 according to some embodiments.

Figure 8A:
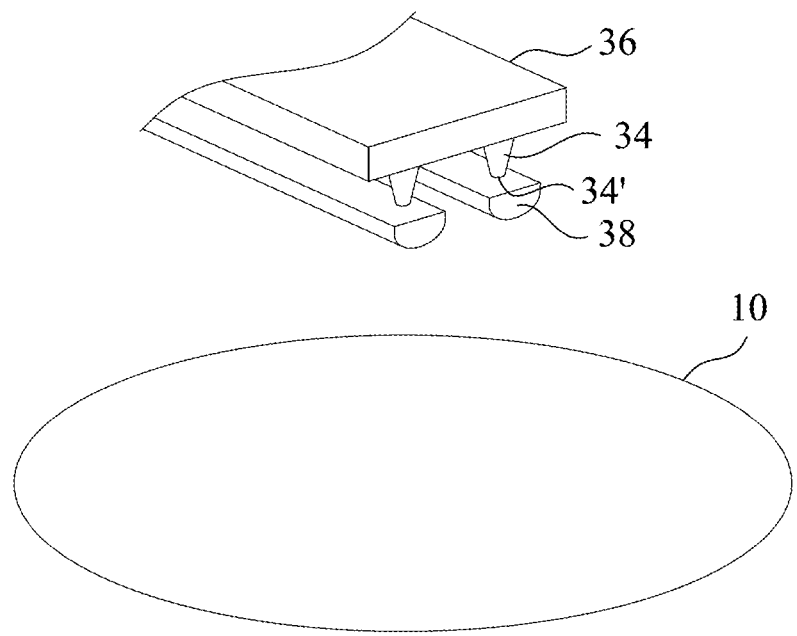
FIGS. 8A-8D illustrate respectively one of sequential operations for the method according to some embodiments.

At operation S202 in FIG. 7, referring to FIG. 8A, a wafer 10 is transported into the chamber 60 (not shown) for performing cleaning process. In some embodiments, the wafer is transported by a transfer arm. In certain embodiments, the wafer is deposited with blanket layers. In other embodiments, the wafer includes patterns to be formed as a part of circuits of semiconductor device.

Optionally, the wafer 10 can be rotated after transporting the wafer 10 into the chamber 60. In some embodiments, the wafer is rotated at a spin speed ranging from about 500 rpm to about 3000 rpm.

Operation S202 is followed by operation S204. Referring to 8A, the nozzle 34 is moved to a location over the wafer 10. In some embodiment, the nozzle 34 is moved to a location over the wafer 10 and aligns to the center of the wafer 10 in direction of gravity. In some embodiment, the nozzle 34 is moved to a location over the wafer 10 and aligns the area within about 4 inches from the wafer center in direction of gravity.

Figure 8B:
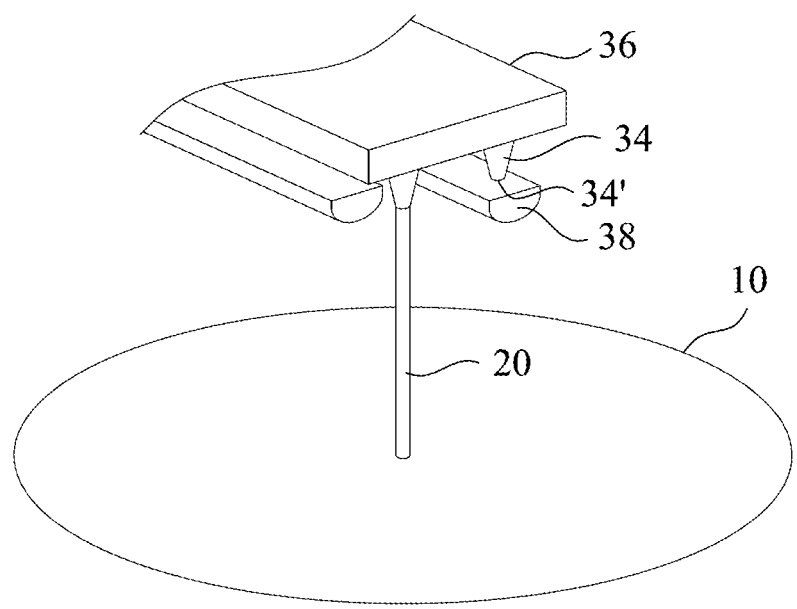

Operation S204 is followed by operation S206. Referring to FIG. 8B, a process liquid 20 is applied onto the wafer 10 from the nozzle 34 for cleaning the wafer 10. The process liquid 20 is supplied with a flow rate continuously from the nozzle 34, thereby the process liquid spread out on surfaces of the wafer 10. In some embodiment, the surfaces of the wafer are immersed in the process liquid and received continuously treatment from the process liquid. In some embodiment, the process liquid can be provided with multiple shots from the nozzle, and the surfaces of the wafer receive multiple iterations of treatments.

If the nozzle 34 is shield from the wafer 10 by a cup 38 before performing operation S206, the method 200 further includes an operation of moving the cup back to a position where the cup 38 is free of shielding the nozzle 34. In other words, the nozzle 34 is moved to a position that the nozzle 34 is able to apply the process liquid to onto the wafer 10 without hindered by the cup 38.

In some embodiment, the process liquid is selected from the group consisting of HCl, $NH_4OH$, $H_2SO_4$, $H_2O_2$, $H_2O$ and a combination thereof. In some embodiments, the wafer is rotated at the spin speed ranging from about 500 rpm to about 3000 rpm when applying the process liquid onto the wafer. In other embodiments, the wafer in not rotated when applying the process liquid onto the wafer.

Figure 8C:
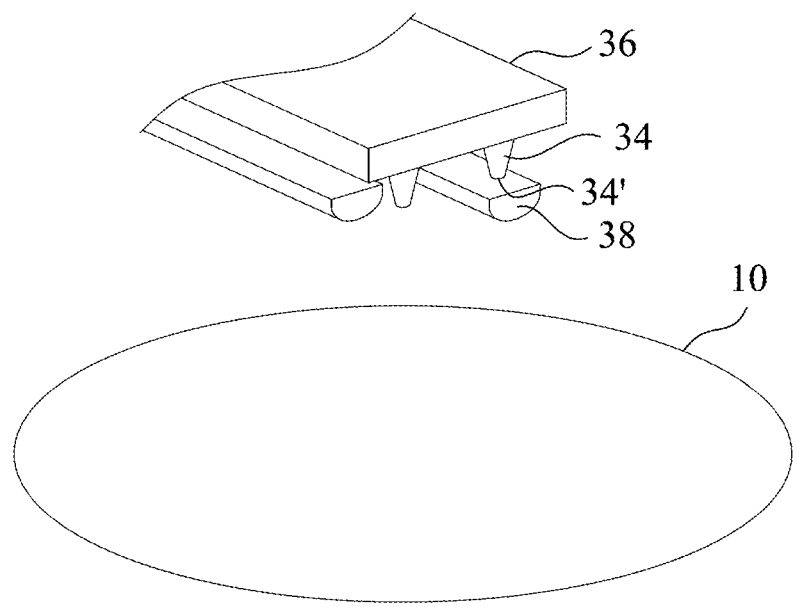

Operation S206 is followed by operation S208. Referring to FIG. 8C, the applying of process liquid 20 is stopped after the wafer 10 is finished processed. In some embodiments, the applying of the process liquid is stopped after the wafer is treated by the process liquid for about 0.1 to about 20 minutes. In some embodiments, the applying of the process liquid is stopped after the wafer is treated by the process liquid for about 90 to about 180 seconds.

Figure 8D:
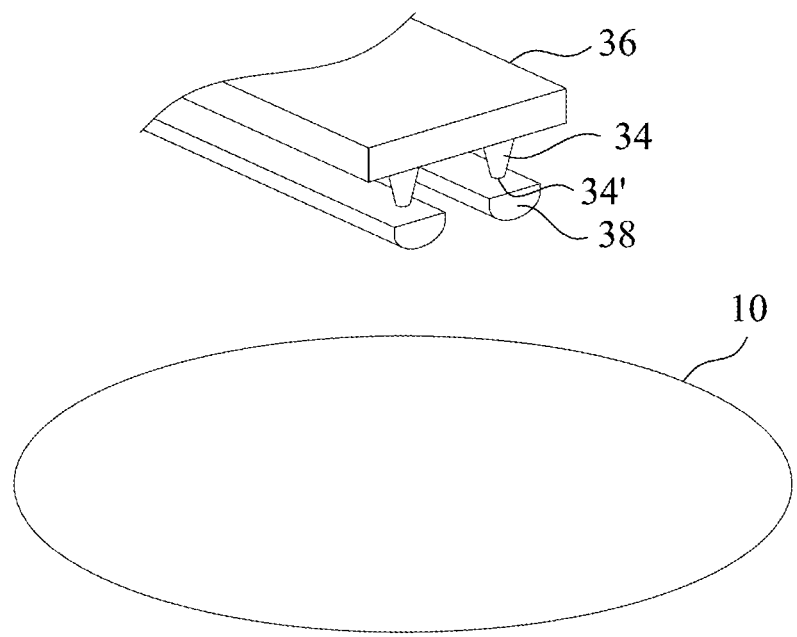

Operation S208 is followed by S210. Referring to FIG. 8D, the cup 38 is moved to a first position below the nozzle 34 to shield the nozzle 34 from the wafer 10. After the operation S206, a portion of process liquid may be retained on the nozzle tip 34' and can accidentally fall in the direction of gravity, the cup 38 is used to collect the process liquid 20 dropped from the nozzle 34.

The cup 38 collects the dropped process liquid from the nozzle 34, and the process liquid is built up inside the cup 38. To avoid a flooding of the process liquid from the cup 38, the collected process liquid is purged out of the cup 38 via a drain pipeline (not shown).

The present invention discloses a method M200 which is used for cleaning wafers. The method M200 can reduce amount of the defects formed by the process liquid dropped accidentally onto the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a wafer chuck;
   a first nozzle over the wafer chuck;
   an actuator; and
   a first elongated cup coupled to the actuator and capable of moving from a first position to a second position, wherein
   at the first position, the first elongated cup shields the first nozzle from the wafer chuck, and at the second position, the first elongated cup is free of shielding the first nozzle from the wafer chuck.

2. The device of claim 1, wherein the first elongated cup includes a first end closer to the first nozzle and a second end away from the first nozzle, wherein the second end is below the first end when the first elongated cup is at the first position.

3. The device of claim 1, wherein the first elongated cup includes a first end closer to the first nozzle and a second end away from the first nozzle, wherein the first end and the second end are substantially at a same horizontal level when the first elongated cup is at the second position.

4. The device of claim 1, further comprising:
a second nozzle disposed next to the first nozzle; and
a second elongated cup coupled to the actuator and capable of moving from a third position to a fourth position, wherein
at the third position, the second elongated cup shields the second nozzle from the wafer chuck, and
at the fourth position, the second elongated cup is free of shielding the second nozzle from the wafer chuck.

5. The device of claim 1, wherein the first elongated cup is substantially made of Teflon™.

6. The device of claim 1, wherein the first nozzle has a nozzle tip and the first elongated cup has a holding space, wherein the nozzle tip is located in the holding space when the first elongated cup is at the first position.

7. The device of claim 1, wherein the first elongated cup includes at least a sidewall having a curvature.

8. A device, comprising:
a chamber;
a wafer chuck in the chamber;
a first nozzle over the wafer chuck;
an actuator;
a first elongated cup coupled to the actuator and capable of moving from a first position to a second position, wherein at the first position, the first elongated cup shields the nozzle from the wafer chuck, and at the second position, the first elongated cup is free of shielding the nozzle from the wafer chuck; and
a drain pipeline coupled to the first elongated cup.

9. The device of claim 8, wherein the first elongated cup includes a first end closer to the first nozzle and a second end away from the first nozzle, wherein the second end is below the first end when the first elongated cup is at the first position.

10. The device of claim 8, wherein the first elongated cup includes a first end closer to the first nozzle and a second end away from the first nozzle, wherein the first end and the second end are substantially at a same horizontal level when the first elongated cup is at the second position.

11. The device of claim 8, further comprising:
a second nozzle disposed next to the first nozzle; and
a second elongated cup coupled to the actuator and capable of moving from a third position to a fourth position, wherein
at the third position, the second elongated cup shields the second nozzle from the wafer chuck, and
at the fourth position, the second elongated cup is free of shielding the second nozzle from the wafer chuck.

12. The device of claim 8, wherein the first elongated cup is substantially made of Teflon™.

13. The device of claim 8, wherein the first nozzle has a nozzle tip and the first elongated cup has a holding space, wherein the nozzle tip is located in the holding space when the first elongated cup is at the first position.

14. The device of claim 8, wherein the first elongated cup includes at least a sidewall having a curvature.

15. A method, comprising:
transporting a wafer into a chamber;
moving a nozzle to a location over the wafer;
applying a process liquid onto the wafer from the nozzle after moving the nozzle to the location;
stopping applying the process liquid; and
after stopping applying the process liquid, moving a cup to a first position to shield the nozzle from the wafer.

16. The method of claim 15, further comprising:
moving the cup to a second position where the cup is free of shielding the nozzle from the wafer before applying the process liquid onto the wafer from the nozzle.

17. The method of claim 15, further comprising:
using the cup to collect a portion of the process liquid dropped from the nozzle after moving the cup to the first position to shield the nozzle from the wafer.

18. The method of claim 17, further comprising:
purging the portion of the process liquid out of the cup via a drain pipeline after moving the cup to the first position to shield the nozzle from the wafer.

19. The method of claim 15, wherein the process liquid is selected from the group consisting of HCl, $NH_4OH$, $H_2SO_4$, $H_2O_2$, $H_2O$ and a combination thereof.

20. The method of claim 15, further comprising:
spinning the wafer at a spin speed ranging from about 500 rpm to about 3000 rpm after transporting the wafer into the chamber.

* * * * *